United States Patent
Miyazaki et al.

(10) Patent No.: US 9,253,386 B2
(45) Date of Patent: Feb. 2, 2016

(54) CAMERA MODULE

(71) Applicant: TAIYO YUDEN CO., LTD., Tokyo (JP)

(72) Inventors: Masashi Miyazaki, Tokyo (JP); Yuichi Sugiyama, Tokyo (JP); Tatsuro Sawatari, Tokyo (JP); Hideki Yokota, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/155,311

(22) Filed: Jan. 14, 2014

(65) Prior Publication Data

US 2014/0253794 A1    Sep. 11, 2014

(30) Foreign Application Priority Data

Mar. 5, 2013  (JP) .................................. 2013-43082

(51) Int. Cl.
*H04N 5/225* (2006.01)
*H01L 23/00* (2006.01)

(52) U.S. Cl.
CPC .............. *H04N 5/2257* (2013.01); *H01L 24/47* (2013.01); *H04N 5/2253* (2013.01); *H01L 2224/48091* (2013.01); *H01L 2224/48227* (2013.01); *H04N 5/2254* (2013.01)

(58) Field of Classification Search
CPC .............. H04N 5/335; H04N 5/2252–5/2254; H04N 5/2257; H01L 2224/48227; H01L 27/14618; H01L 31/0203; H01L 24/42–24/49

USPC .................................. 348/294, 340, 373, 374
See application file for complete search history.

(56) References Cited

U.S. PATENT DOCUMENTS

| | | | |
|---|---|---|---|
| 2004/0119862 A1* | 6/2004 | Hsieh et al. | 348/294 |
| 2006/0228103 A1* | 10/2006 | Go | 396/268 |
| 2008/0283952 A1* | 11/2008 | Choi et al. | 257/433 |
| 2010/0123811 A1* | 5/2010 | Abe | 348/294 |
| 2014/0218573 A1* | 8/2014 | Hagiwara et al. | 348/294 |

FOREIGN PATENT DOCUMENTS

JP    2011-035458 A    2/2011

* cited by examiner

*Primary Examiner* — Paul Berardesca
(74) *Attorney, Agent, or Firm* — Chen Yoshimura LLP

(57) ABSTRACT

A camera module, in which a recessed portion that has a greater depth than the thickness of an imaging device is disposed on the surface (top surface) of an embedded-component substrate. An imaging device is bonded to a bottom of the recessed portion such that an opening is present between the surface (top surface) of the imaging device and the surface (top surface) of the embedded-component substrate. Connection pads on the imaging device are connected to conductor pads disposed on the surface (top surface) of the embedded-component substrate by bonding wires that go through the opening.

6 Claims, 2 Drawing Sheets

CAMERA MODULE

This application claims the benefit of Japanese Application No. 2013-43082, filed in Japan on Mar. 5, 2013, which is hereby incorporated by reference in its entirety.

BACKGROUND OF THE INVENTION

1. Field of the Invention

The present invention relates to a camera module using an embedded-component substrate.

2. Description of Related Art

Disclosed in FIG. 16 of Patent Document 1 below is a configuration of a camera module, used in mobile devices such as mobile phones and smartphones, that uses an embedded-component substrate (a multilayer substrate with electronic components embedded therein) instead of a wiring substrate.

This type of camera module must ensure a gap corresponding to the minimum focal distance between the light-receiving part of the imaging device and the lenses. Therefore, it is difficult to reduce the height of the camera module, or in other words, for the camera module to be made thinner, in a structure in which the imaging device is bonded to the surface (top surface) of the embedded-component substrate, as in FIG. 16 in Patent Document 1 below.

Mobile devices such as mobile phones and smartphones becoming thinner has led to strong demand for this type of camera module to also be thinner. In view of this, the development of a camera module that satisfies this demand is of the utmost importance.

RELATED ART DOCUMENT

Patent Document

Patent Document 1: Japanese Patent Application Laid-Open Publication No. 2011-035458

SUMMARY OF THE INVENTION

The present invention aims at providing a camera module that can satisfy the demand to be thinner.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention is a camera module that includes: an embedded-component substrate having electronic components embedded therein; an imaging device bonded to the embedded-component substrate; and lenses disposed above the imaging device, wherein a recessed portion having a greater depth than a thickness of the imaging device is formed in a surface of the embedded-component substrate, wherein the imaging device is bonded to a bottom of the recessed portion such that a surface of the imaging device is lower than the surface of the embedded-component substrate, thereby creating an opening above the surface of the imaging device, and wherein a connection pad on the imaging device is connected to a conductor pad disposed on the surface of the embedded-component substrate by a bonding wire that goes through the opening.

According to the present invention, a camera module that can satisfy the demand of being thinner can be provided.

The above-mentioned goal and other goals of the present invention, features, and effects according to these respective goals shall be made clear by the explanation below and the accompanying drawings.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Figure 1A:
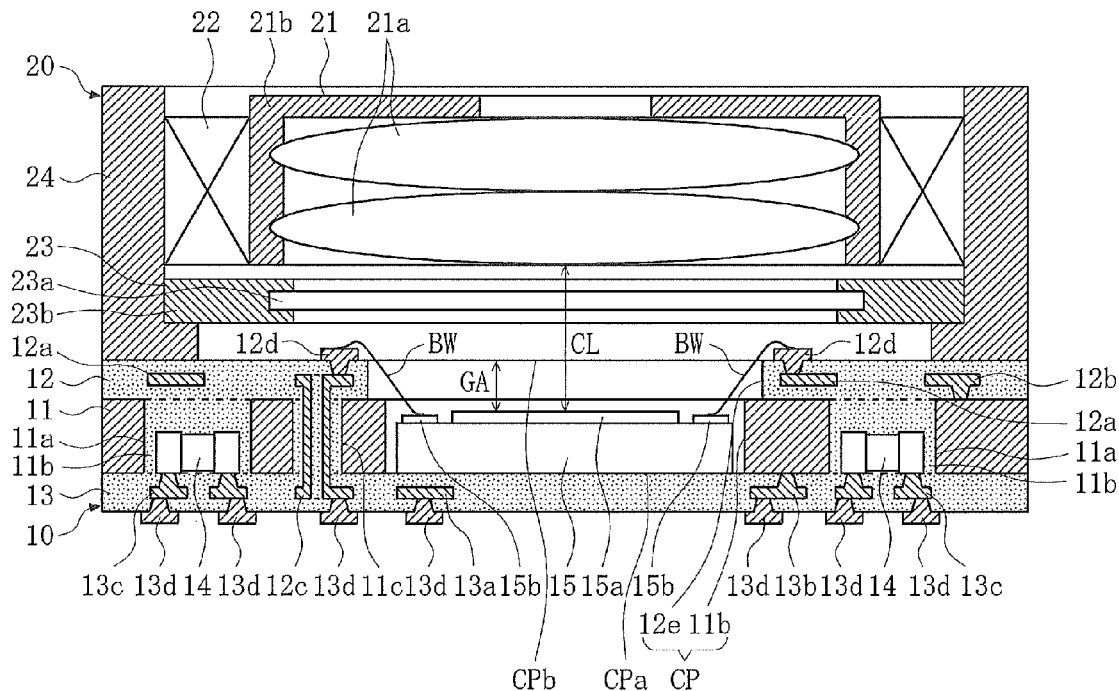
FIG. 1A is a vertical cross-sectional view showing a camera module of the present invention.

First, the structure of the camera module shown in FIG. 1A will be explained. This camera module is provided with various types of devices and circuits for performing camera functions and is constituted of an embedded-component substrate 10 and an optical package 20 attached thereto. The camera module has a substantially cuboid shape as a whole. For reference, a size example of the camera module shown in FIG. 1A has a length and width (the horizontal direction in FIG. 1A) of approximately 8.5 mm, and a height (the vertical direction in FIG. 1A) of approximately 5 mm.

The embedded-component substrate 10 is provided with: a core layer 11 that is made of a conductive material and that also acts as ground wiring; a first insulating layer 12 disposed on a surface (top surface) in the thickness direction of the core layer 11; and a second insulating layer 13 disposed on another surface (bottom surface) in the thickness direction of the core layer 11.

Through-holes 11a for housing components, through-holes 11b that form a portion of a recessed portion CP described later, and a through-hole 11c for arranging a conductor via are disposed in the core layer 11. An electronic component 14 such as a capacitor, inductor, resistor, filter chip, or IC chip is suitably housed in each through-hole 11a for housing components, for example, and an insulating material is filled in the gap between the housed electronic component 14 and the through-hole 11a. In other words, each electronic component 14 is embedded in the core layer 11, or namely, the embedded-component substrate 10.

Two-dimensionally patterned signal wiring 12a and ground wiring 12b are disposed in the first insulating layer 12. Two-dimensionally patterned signal wiring 13a and ground wiring 13b, and conductor vias 13c that have a "T" shape in a cross-sectional view, are disposed in the second insulating layer 13. A cylindrical conductor via 12c that reaches from the first insulating layer 12 to the second insulating layer 13 through the through-hole 11c in the core layer 11 is also disposed in the first insulating layer 12 and second insulating layer 13. Conductor pads 12d and conductor pads 13d that have a "T" shape in a cross-sectional view are respectively disposed in the surface (top surface) of the first insulating layer 12 and in the surface (bottom surface) of the second insulating layer 13.

Based on FIG. 1A, the first and second conductor pads 13d from the left respectively connect to a terminal of the electronic component 14 on the left side through the conductor vias 13c, and the first and second conductor pads 13d from the right respectively connect to a terminal of the electronic component 14 on the right side through the conductor vias 13c. The third conductor pad 13d from the left is connected to the conductor pad 12d on the left side through the conductor via 12c. The fourth conductor pad 13d from the left connects to the signal wiring 13a, the third conductor pad 13d from the right connects to the ground wiring 13b, and a via portion (no reference character) of the ground wiring 13b is connected to the core layer 11. The conductor pad 12d on the right side connects to the signal wiring 12a, and a via portion (no reference character) of the ground wiring 12b is connected to the core layer 11.

In addition, a through-hole 12e that forms another portion of the recessed portion CP described later is disposed in the first insulating layer 12 in a location directly above the through-hole 11b in the core layer 11. The cross-sectional area of this through-hole 12e is larger than the cross-sectional area of the through-hole 11b in the core layer 11, and the center line of the through-hole 12e substantially corresponds to the center line of the through-hole 11b. In other words, the recessed portion CP, which is constituted of the through-hole 12e in the first insulating layer 12 and the through-hole 11b in the core layer 11, is provided in the surface (top surface) of the embedded-component substrate 10. The depth of this recessed portion CP is greater than the thickness of an imaging device 15 described later, and the area of an opening CPb (the opening on the surface of the embedded-component substrate 10) is larger than the area of a bottom CPa of the recessed portion CP. The inner walls (no reference character) of the recessed portion CP have a step-like cross-sectional shape.

The imaging device 15, such as a CMOS image sensor or CCD image sensor, is bonded to the bottom CPa of the recessed portion CP with an adhesive agent. This imaging device 15 has a light-receiving part 15a on the center of the surface (top surface) thereof and a plurality of connection pads 15b on the periphery of the imaging device 15. As described above, the depth of the recessed portion CP is greater than the thickness of the imaging device 15, and thus, an opening GA is present between the surface (top surface) of the imaging device bonded to the bottom CPa of the recessed portion CP and the surface (top surface) of the embedded-component substrate 10. The connection pads 15b on the imaging device 15 are connected to the conductor pads 12d disposed on the surface (top surface) of the embedded-component substrate 10 by bonding wires BW that go through the opening GA present between the surface (top surface) of the imaging device 15 and the surface (top surface) of the embedded-component substrate 10.

Based on FIG. 1A, when the outline of the imaging device 15 is substantially rectangular, the outline (the cross-section of the through-hole 11b) of the bottom CPa of the recessed portion CP and the outline (the cross-section of the through-hole 12e) of the opening CPa have a substantially rectangular shape that is similar to the outline of the imaging device 15. If the outline (the cross-section of the through-hole 11b) of the bottom CPa of the recessed portion CP is made too large in relation to the outline of the imaging device 15, then the length and width (the horizontal direction in FIG. 1A) will be needlessly increased, and thus, the outline (the cross-section of the through-hole 11b) of the bottom CPa is the smallest size that permits insertion of the imaging device 15.

Figure 1B:
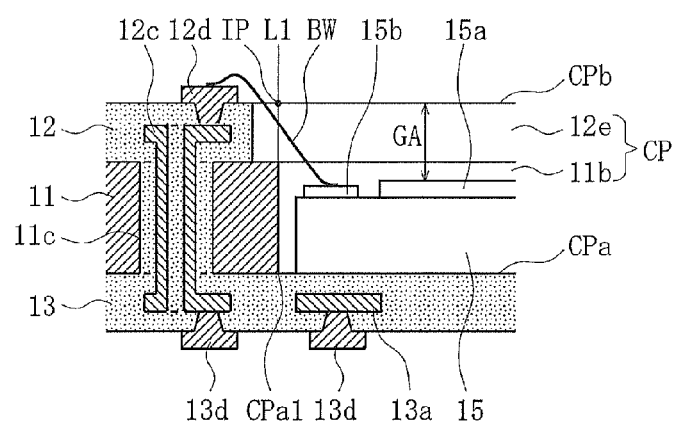
FIG. 1B is a magnified view showing main components of FIG. 1A.

Based on FIG. 1B, it is preferable for the bonding wires BW to be disposed such that, when a line L1 perpendicular with respect to the bottom CPa is drawn from an outer edge CPa1 of the bottom CPa of the recessed portion CP, the bonding wires BW pass below an intersection point IP of the line L1 and the opening CPb of the recessed portion CP. Such an arrangement aspect of the bonding wires BW enables connection between the connection pads 15b on the imaging device 15 and the conductor pads 12d of the embedded-component substrate 10 while greatly reducing the wire length of the bonding wires BW that go through the opening GA in the recessed portion CP, in which the area of the opening CPb is larger than the area of the bottom CPa.

The core layer 11 of the embedded-component substrate 10 is made of a conductive material such as copper or a copper alloy, and the thickness of the core layer 11 is in the range of 100 to 400 μm, for example. The insulating material, the first insulating layer 12, and the second insulating layer 13 are made of an epoxy resin, a polyimide, a bismaleimide-triazine resin, or a compound resin (possible to use a thermoplastic material in addition to a thermosetting material) such as a material that includes a reinforced filler made of silicon dioxide or the like in the above. The thickness of the first insulating layer 12 and second insulating layer 13 is in the range of 30 to 90 μm, for example. The signal wiring 12a and 13a, the ground wiring 12b and 13b, the conductor vias 12c and 13c, and the conductor pads 12d and 13d are made of a conductive material such as copper or a copper alloy, and the thickness of the signal wiring 12a and 13a and the ground wiring 12b and 13b is in the range of 5 to 25 μm, for example.

The optical package 20 is provided with: a lens unit 21; an actuator 22 for auto-focus, arranged around the lens unit 21; a filter unit 23 arranged below the lens unit 21; and a case 24 that includes the lens unit 21, actuator 22, and filter unit 23.

The lens unit 21 has a plurality (2 in the drawing) of lenses 21a, and a cylindrical holder 21b that surrounds the lenses 21a. The actuator 22 for auto-focus is equipped with a movable coil and a fixed permanent magnet, for example. The actuator 22 performs focusing by moving the lens unit 21 in the vertical direction on the basis of driving signals inputted to the movable coil. The filter unit 23 has an optical filter 23a such as an IR cut filter, and a looped holder 23b that surrounds the optical filter 23a. The case 24 has a substantially cuboid-shaped outer appearance, and covers the lens unit 21, actuator 22, and filter unit 23 arranged therein. This case 24 is attached to the embedded-component substrate 10 by a joining method such as fitting or adhesion such that the lenses 21a and optical filter 23a are positioned directly above the imaging device 15 of the embedded-component substrate 10. The case 24 is electrically connected to circuits built on the embedded-component substrate 10 through a terminal (not shown).

Next, effects obtained by the camera module shown in FIG. 1A will be explained. This camera module has the recessed portion CP, which has a greater depth than the thickness of the imaging device 15, in the surface (top surface) of the embedded-component substrate 10. The imaging device 15 is bonded to the bottom CPa of the recessed portion CP such that the opening GA is present between the surface (top surface) of the imaging device 15 and the surface (top surface) of the embedded-component substrate 10. The connection pads 15b on the imaging device 15 are connected to the conductor pads 12d disposed on the surface (top surface) of the embedded-component substrate 10 by the bonding wires BW that go through the opening GA.

In other words, even if a gap CL (see FIG. 1A) corresponding to the minimum focal distance between the light-receiving part 15a of the imaging device 15 and the lenses 21a must be ensured, the imaging device 15 is bonded to the bottom CPa of the recessed portion CP; therefore, the lenses 21a can be arranged near the surface (top surface) of the embedded-component substrate 10, thereby making it possible to satisfy the demands of reducing the height of the camera module and making the camera module thinner. Furthermore, most portions of the bonding wires BW are housed within the opening GA, and the height of the portions that protrude upwards from the surface (top surface) of the embedded-component substrate 10 can be greatly reduced. Thus, this eliminates the disadvantage of not being able to arrange the lenses 21a near the surface (top surface) of the embedded-component substrate 10 due to the height of these parts that protrude upwards, and can further contribute to a camera module that has a reduced height (thinner).

The area of the opening CPb of the recessed portion CP is larger than the area of the bottom CPa to which the imaging device 15 is bonded, and thus, the wire length of the bonding wires BW necessary for connection between the connection pads 15b on the imaging device 15 and the conductor pads 12d of the embedded-component substrate 10 can be kept as short as possible, and this shortening of the wire length can contribute to a reduction in cost.

The recessed portion CP is constituted of the through-hole 11b disposed in the core layer 11 of the embedded-component substrate 10 and the through-hole 12e disposed in the first insulating layer 12, and thus, a recessed portion CP with an opening CPb that has a larger area than a bottom CPa can be formed on the embedded-component substrate 10 with ease by forming the through-hole 11b during the manufacturing of the core layer 11 and by forming the through-hole 12e during the manufacturing of the first insulating layer 12.

Figure 2A:
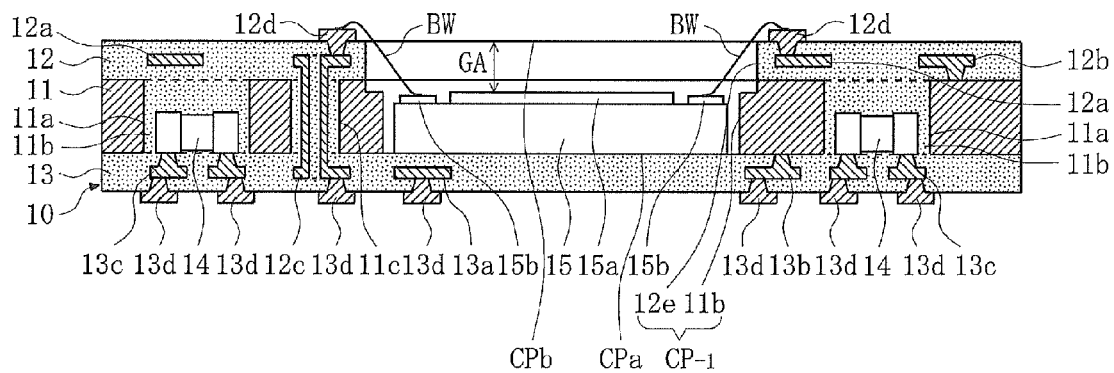
FIGS. 2A to 2C are vertical cross-sectional views of an embedded-component substrate that show modification examples of a recessed portion shown in FIG. 1A.

Next, modification examples of the recessed portion CP shown in FIG. 1A will be explained. FIG. 2A shows a first modification example, in which a recessed portion CP-1 shown in the drawing differs from the recessed portion CP shown in FIG. 1A in that a portion of the through-hole 11b that is the same as the cross-section of the through-hole 12e in the first insulating layer 12 is formed above the through-hole 11b in the core layer 11 to increase the depth of the portion having the same cross-sectional area as the through-hole 12e. The inner walls of the recessed portion CP-1 have a step-like cross-sectional shape, which is the same as the recessed portion CP. This recessed portion CP-1 can achieve similar effects to those described above when used as a substitute for the recessed portion CP shown in FIG. 1A.

Figure 2B:
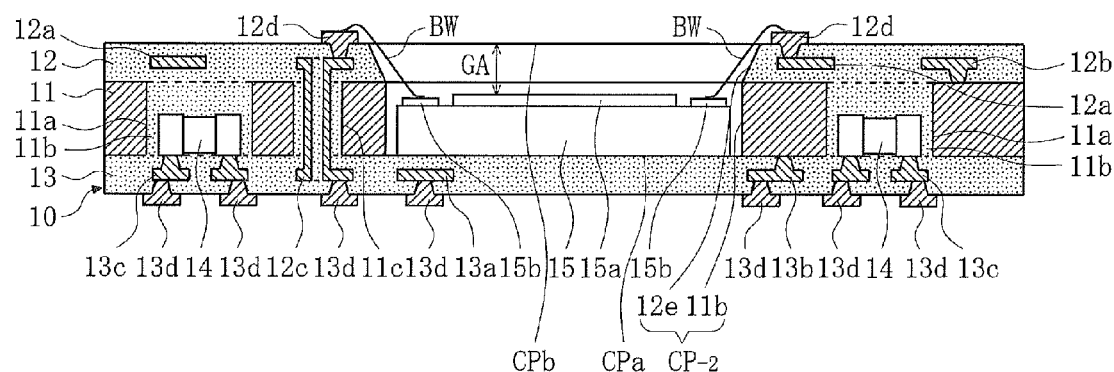

FIG. 2B shows a second modification example, in which a recessed portion CP-2 shown in the drawing differs from the recessed portion CP shown in FIG. 1A in that the cross-sectional area of the through-hole 12e in the first insulating layer 12 becomes gradually smaller towards the core layer 11. This makes the inner walls of the recessed portion CP-2 have a cross-sectional shape in which slanted portions that are at an acute angle to the surface (top surface) of the embedded-component substrate 10 are on the opening CPb sides thereof. This recessed portion CP-2 can achieve similar effects to those described above when used as a substitute for the recessed portion CP shown in FIG. 1A.

Figure 2C:
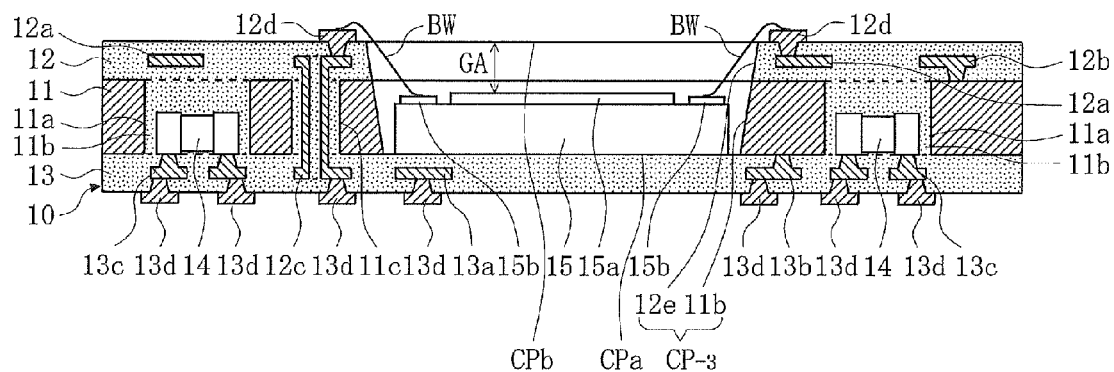

FIG. 2C shows a third modification example, in which a recessed portion CP-3 shown in the drawing differs from the recessed portion CP shown in FIG. 1A in that the cross-sectional area of the through-hole 12e in the first insulating layer 12 becomes gradually smaller towards the core layer 11, and, the cross-sectional area of the through-hole 11b in the core layer 11 becomes gradually smaller towards the second insulating layer 13. This makes the inner walls of the recessed portion CP-3 have a cross-sectional shape in which slanted portions that are at an acute angle to the surface (top surface) of the embedded-component substrate 10 are on the entirety thereof. This recessed portion CP-3 can achieve effects similar to those described above when used as a substitute for the recessed portion CP shown in FIG. 1A.

In FIG. 1A and FIGS. 2A to 2C, the embedded-component substrate 10 having a core layer 11 made of a conductive material was shown, but similar effects can be achieved even if the embedded-component substrate has the core layer 11 made of a non-conductive material, such as a compound resin or ceramic, for example. Needless to say, similar effects can be achieved even if an embedded-component substrate is used that has the core layer 11 and insulating material made of a single layer-like insulating material, or more specifically, even if an embedded-component substrate has electronic components embedded in a single layer-like insulating material.

In FIG. 1A and FIGS. 2A to 2C, configurations were shown in which the recessed portions CP, CP-1, CP-2, and CPCP-3 were constituted of the through-hole 11b in the core layer 11 and the through-hole 12e in the first insulating layer 12, but similar effects can be achieved even if the through-hole 11b in the core layer 11 is changed to a hole with a bottom (a non-through-hole). Needless to say, similar effects can be achieved even if a hole with a bottom (a non-through-hole) is formed in the single layer-like insulating material in the embedded-component substrate that has the core layer 11 and insulating material made of a single layer-like insulating material.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A camera module, comprising:
    an embedded-component substrate having electronic components embedded therein;
    an imaging device bonded to the embedded-component substrate; and
    lenses disposed above the imaging device,
    wherein a recessed portion having a greater depth than a thickness of the imaging device is formed in an uppermost surface of the embedded-component substrate,
    wherein the imaging device is bonded to a bottom of the recessed portion such that a surface of the imaging device is lower than the uppermost surface of the embedded-component substrate, thereby creating an opening above the surface of the imaging device,
    wherein a connection pad on the imaging device is connected to a conductor pad disposed on the uppermost surface of the embedded-component substrate by a bonding wire that goes through the opening,
    wherein the embedded-component substrate comprises:
        a core layer made of a conductive material, the core layer being the thickest layer among layers in the embedded-component substrate;
        a first insulating layer that is disposed on one surface in a thickness direction of the core layer and that has wiring therein; and
        a second insulating layer that is disposed on another surface in the thickness direction of the core layer and that has wiring therein, wherein the recessed portion includes a through-hole formed in the first insulating layer and a through-hole formed in the core layer, and wherein the imaging device is embedded within the through-hole in the core layer.

2. The camera module according to claim 1, wherein the recessed portion has an opening in the uppermost surface of the embedded-component substrate having a larger area than an area of the bottom of the recessed portion to which the imaging device is bonded.

3. The camera module according to claim 2, wherein an inner wall of the recessed portion has a step-like cross-sectional shape.

4. A camera module according to claim 2, wherein an inner wall of the recessed portion has a cross-sectional shape in which a slanted portion that forms an acute angle to the uppermost surface of the embedded-component substrate is provided on at least an opening side of the recessed portion.

5. A camera module, comprising:

an embedded-component substrate having electronic components embedded therein;

an imaging device bonded to the embedded-component substrate; and a case that houses lenses such that the lenses are disposed directly above the imaging device, the case being fixed on an uppermost surface of the embedded-component substrate, wherein a recessed portion having a greater depth than a thickness of the imaging device is formed in the uppermost surface of the embedded-component substrate, wherein the imaging device is bonded to a bottom of the recessed portion such that a surface of the imaging device is lower than the uppermost surface of the embedded-component substrate, thereby creating an opening above the surface of the imaging device, wherein a connection pad on the imaging device is connected to a conductor pad disposed on the uppermost surface of the embedded-component substrate by a bonding wire that goes through the opening, wherein the embedded-component substrate comprises:

a core layer made of a conductive material, the core layer being the thickest layer among layers in the embedded-component substrate;

a first insulating layer that is disposed on one surface in a thickness direction of the core layer and that has wiring therein; and a second insulating layer that is disposed on another surface in the thickness direction of the core layer and that has wiring therein, wherein the recessed portion includes a through-hole formed in the first insulating layer and a through-hole formed in the core layer, and wherein the imaging device is embedded within the through-hole in the core layer.

6. The camera module according to claim 5, wherein said bonding wire passes below a virtual intersection point formed by a virtual horizontal line extending from the uppermost surface of the embedded-component substrate toward said opening and a virtual vertical line rising from an edge of a bottom of the through-hole in the core layer.

\* \* \* \* \*